United States Patent
Chen

(10) Patent No.: US 9,012,317 B2
(45) Date of Patent: Apr. 21, 2015

(54) FLASH MEMORY AND FABRICATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventor: Yong Chen, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/192,893

(22) Filed: Feb. 28, 2014

(65) Prior Publication Data

US 2015/0084110 A1  Mar. 26, 2015

(30) Foreign Application Priority Data

Sep. 24, 2013  (CN) .......................... 2013 1 0439584

(51) Int. Cl.
*H01L 29/788* (2006.01)
*H01L 29/66* (2006.01)

(52) U.S. Cl.
CPC ........ *H01L 29/788* (2013.01); *H01L 29/66825* (2013.01)

(58) Field of Classification Search
CPC ..................... H01L 29/42328; H01L 29/4232; H01L 29/42324
USPC ........................................... 438/585; 257/392
See application file for complete search history.

(56) References Cited

U.S. PATENT DOCUMENTS

2009/0250768 A1* 10/2009 Sato et al. ..................... 257/392

* cited by examiner

*Primary Examiner* — Marc Armand
(74) *Attorney, Agent, or Firm* — Anova Law Group, PLLC

(57) ABSTRACT

A method is provided for forming a flash memory. The method includes providing a semiconductor substrate; and forming a first dielectric layer. The method also includes forming a first semiconductor layer on a surface of the first dielectric layer; and performing an ion implantation onto a portion of the first semiconductor layer corresponding to a position of a subsequently formed floating gate. Further, the method includes performing an oxygen ion implantation process onto a portion of the first semiconductor layer between the position of the subsequently formed floating gate and the position of a subsequently formed first select gate to form an oxide layer; and forming a second dielectric layer having an opening exposing the position of the first select gate. Further, the method also includes forming a second semiconductor layer on the second dielectric layer; and forming a flash cell and a select gate structure.

15 Claims, 5 Drawing Sheets

FLASH MEMORY AND FABRICATION METHOD THEREOF

CROSS-REFERENCES TO RELATED APPLICATIONS

This application claims the priority of Chinese patent application No. 201310439584.8, filed on Sep. 24, 2013, the entirety of which is incorporated herein by reference.

FIELD OF THE INVENTION

The present invention generally relates to the field of semiconductor manufacturing technology and, more particularly, relates to flash memories and fabrication techniques thereof.

BACKGROUND

Flash memories have been widely used in personal computers and electronic devices as non-volatile memories because they can perform data reading, writing and erasing multiple times; and the data saved in the flash memories will not disappear when the power is off.

A typical flash memory unit includes a floating gate made of doped poly silicon and a control gate. The floating gate and the control gate are insulated by a control gate dielectric layer; and the floating gate and the substrate are insulated by a floating gate dielectric layer. When the flash memory unit performs data writing and erasing, electrons are infused into, or pulled out from the floating gate by controlling the voltages applied on the control gate, the source, the drain and the erasing gate. When the flash memory performs a data reading, a working voltage is applied on the control gate, the on/off status of the channel region under the bottom of the control gate is controlled by the energized state of the floating gate, the data saved in the corresponding flash memory unit may be obtained by measuring the current in the channel region.

However, when the flash memory unit performs a data erasing, it is not easy to control the amount of electrons pulled out from the floating gate, excessive electrons may be pulled out from the floating gate; and the floating gate may be positively charged. Therefore, an over-erasing may happen. When the over-erasing is significantly severe, the channel region under the bottom of the floating gate may be on a conducting state without a working voltage, thus a data misreading may happen.

In order to solve the over-erasing problem of the flash memory unit, a select gate is formed at one side of the control gate and the floating gate to form a separated gate structure. FIG. 1 illustrates an existing flash memory unit having the separated gate structure.

As shown in FIG. 1, the flash memory unit includes a substrate 10; a floating gate oxide layer 11 formed on the surface of the substrate 10; a floating gate 12 formed on the surface of the floating gate oxide layer 11; a control gate oxide layer 13 formed on the surface of the floating gate 12; and a control gate 14 formed on the surface of the control gate oxide layer 13. The flash memory unit also includes sidewall spacers 20 covering side surfaces of the floating gate oxide layer 11, the floating gate 12, the control gate oxide layer 13 and the control gate 14. Further, the flash memory unit includes a select gate oxide layer 15 formed on the surface of the substrate 10 at one side of the floating gate 12 and a select gate 16 formed on the surface of the select gate oxide layer 15. The select gate 16 includes a first select gate 17 and a second select gate 18. The sidewall spacers 20 also cover side surfaces of the select gate oxide layer 15 and the select gate 16. Further, the flash memory unit also includes a shared source/drain region 21 formed in the exposed portion of the substrate 10 between the select gate 16 and the floating gate 12, a source region 22 formed in the exposed substrate 10 at the other side of the select gate 16; and a drain region 23 formed in the exposed portion of the substrate 10 at the other side of the floating gate 12. When the over-erasing phenomena is significantly severe, the channel region under the bottom of the floating gate 12 may be on an "on" state even there is no voltage is applied on the control gate 14. However, the channel region under the bottom of the select gate 16 may keep an "off" state, the source region 22 and the drain region 23 may not be turned on, thus the misreading problem may be prevented.

However, the performance of the flash memory unit may not be stable, thus it may be unable to effectively solve the misreading problem of the flash memory unit caused by the over-erasing. The disclosed device structures and methods are directed to solve the problems set forth above and other problems.

BRIEF SUMMARY OF THE DISCLOSURE

One aspect of the present disclosure includes a method for fabricating a flash memory. The method includes providing a semiconductor; and forming a first dielectric layer on a surface of the semiconductor substrate. The method also includes forming a first semiconductor layer on a surface of the first dielectric layer; and performing an ion implantation onto a portion of the first semiconductor layer corresponding to a position of a subsequently formed floating gate. Further, the method includes performing an oxygen ion implantation onto a portion of the first semiconductor layer between the position of the subsequently formed floating gate and a position of a subsequently formed first select gate to form an oxide layer; and forming a second dielectric layer having an opening exposing the position of the first select gate. Further, the method also include forming a second semiconductor layer on the second dielectric layer; and forming a flash cell and a select gate structure by etching the first dielectric layer, the first semiconductor layer, the oxide layer, the second dielectric layer and the second semiconductor layer.

Another aspect of the present disclosure includes a flash memory. The flash memory includes a semiconductor substrate; and a flash cell having a floating gate dielectric layer formed on a surface of the semiconductor substrate, a floating gate formed on the floating gate dielectric layer, a control gate dielectric layer formed on the floating gate and a control gate formed on the control gate dielectric layer formed on the semiconductor substrate. The flash memory also includes a select gate structure having a select gate dielectric layer formed on the surface of the semiconductor substrate, a first select gate formed on the select gate dielectric layer and a second select gate formed on the first select gate formed on the semiconductor substrate; and a co-source/drain region formed in the semiconductor substrate between the flash cell and the select gate. Further, the flash memory includes a source region formed in the semiconductor substrate at the other side of the flash cell; and a drain region formed in the semiconductor substrate at the other side of the select gate structure.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
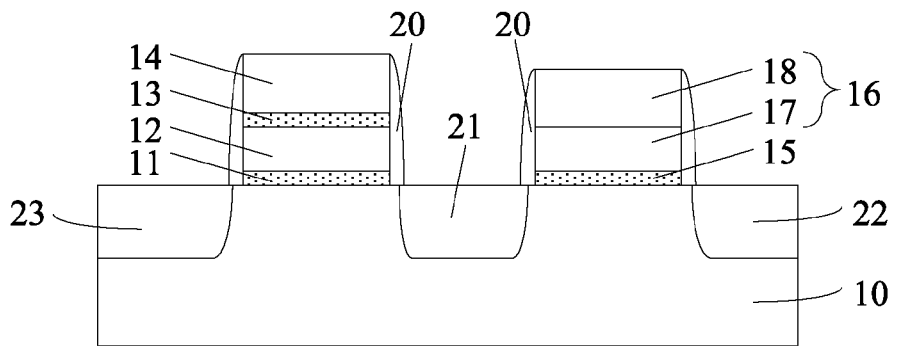
FIG. 1 illustrates an existing flash memory.

Referring to FIG. 1, the first select gate 17 and the floating gate 12 may be often formed by etching a first poly silicon layer (not shown); and the control gate 14 and the second select gate 18 may often be formed by etching a second poly silicon layer (not shown). Further, in order to increase the program margin, the floating gate 12 may be N-type doped; and in order to increase the erase margin, the select gate 16 may be P-type doped. Therefore, in a process for forming the flash memory unit having the separated gate structure, a portion of the first poly silicon layer corresponding to the floating gate 12 may be firstly N-type doped after forming the first poly silicon layer using a mask; and after forming the second poly silicon layer, the second silicon layer may be P-type doped. Because the portion of the first poly silicon layer corresponding to the floating gate 16 may contact with the second poly silicon layer, the P-type doping ions in the second poly silicon layer may diffuse into the first poly silicon layer, which may cause the subsequently formed first select gate 17 to have P-type doping ions.

However, since after performing the N-type doping onto the portion of the first poly silicon layer corresponding to the floating gate 12 using the mask, the N-type ions may also laterally diffuse into the position corresponding to the first select gate 17, thus a poly silicon depletion layer may be formed in the first select gate 17; and it may be unable to effectively keep the channel region under the select gate 16 at an "off" state. Therefore, the source region 22 and the drain region 23 may be still at an "on" state; and it may still cause the data misreading. The performance and stability of the flash memory having the separated gate structure may be unable to match requirements. The disclosed embodiments overcome such problems by turning a portion of the first poly silicon layer into an oxide layer to prevent forming a depletion layer in the first select gate 17.

Figure 9:
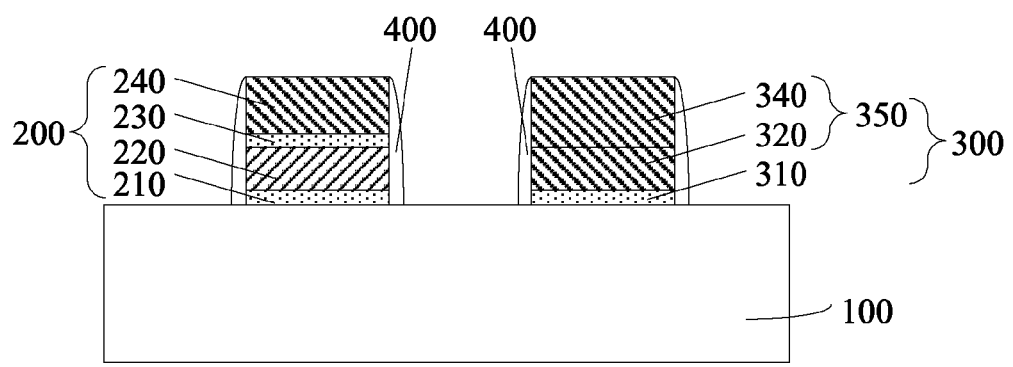
Figure 10:
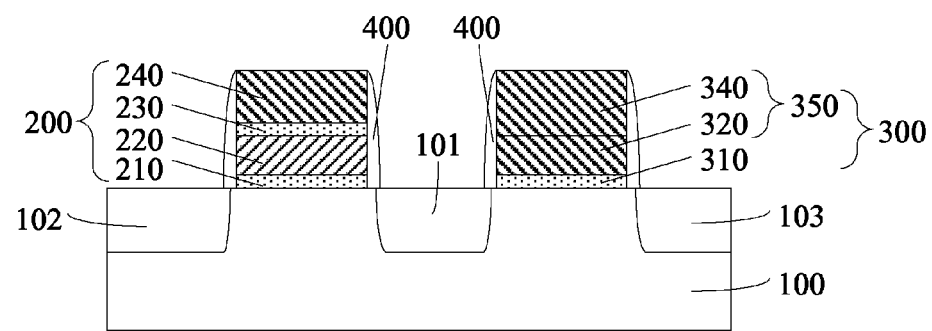
Figure 11:
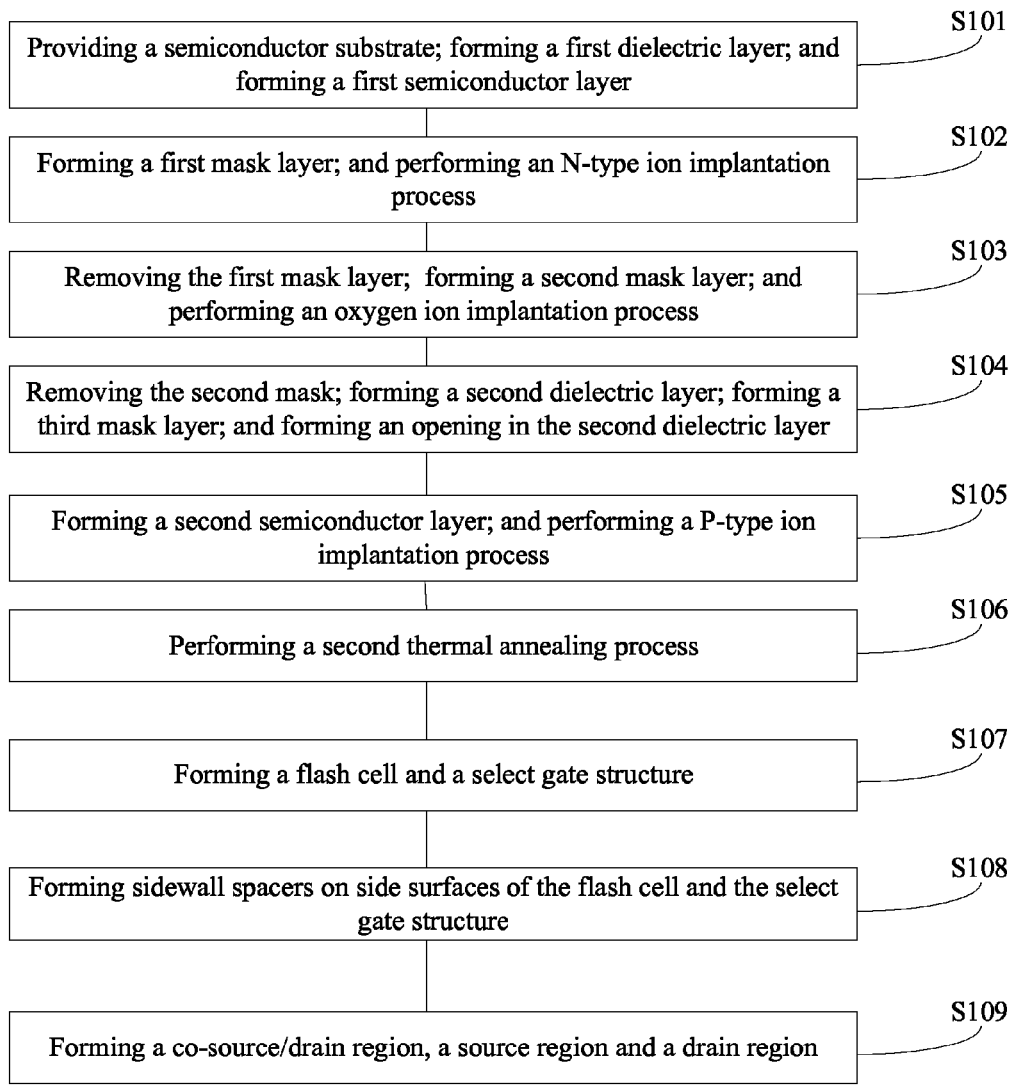
FIG. 11 illustrates an exemplary fabrication process of a flash memory consistent with the disclosed embodiments.

FIG. 11 illustrates an exemplary fabrication process of a flash memory consistent with the disclosed embodiments; and FIGS. 2~10 illustrate semiconductor structures corresponding to certain stages of the exemplary fabrication process.

Figure 2:
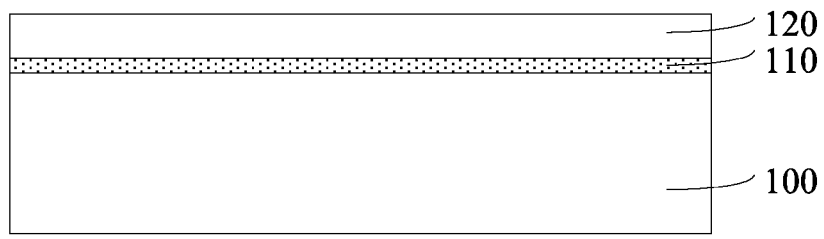
FIGS. 2~10 illustrate semiconductor structures corresponding to certain stages of an exemplary fabrication process of a flash memory.

As shown in FIG. 11, at the beginning of the fabrication process, a semiconductor substrate with certain structures is provided (S101). FIG. 2 illustrates a corresponding semiconductor structure.

As shown in FIG. 2, a semiconductor substrate 100 is provided; a first dielectric layer 110 may be formed on the surface of the semiconductor substrate 100; and a first semiconductor layer 120 may be formed on the surface of the dielectric layer 110.

The semiconductor substrate 100 may include any appropriate semiconductor materials, such as silicon, silicon on insulator (SOI), germanium on insulator (GOI) silicon germanium, carborundum, indium antimonide, lead telluride, indium arsenide, indium phosphide, gallium arsenide, gallium antimonite, or alloy semiconductor, etc. In one embodiment, the semiconductor substrate 100 is silicon. Further, the semiconductor substrate 100 may be N-type doped or P-type doped. The semiconductor substrate 200 provides a base for subsequent structures and processes.

The first dielectric layer 110 may be made of any appropriate material, such as silicon oxide, silicon nitride, or silicon oxynitride, etc. The first dielectric layer 110 may be a single layer structure. In certain other embodiments, the first dielectric layer 110 may be a multiple-stacked structure. In one embodiment, the first dielectric layer 110 is made of silicon oxide. The first dielectric layer 110 may be used to subsequently form a floating gate dielectric layer and a select gate dielectric layer.

Various processes may be used to form the first dielectric layer 110, such as a chemical vapor deposition (CVD) process, a physical vapor deposition (PVD) process, a flowable CVD (FCVD) process, or an atomic layer deposition (ALD) process, etc.

The first semiconductor material layer 120 may be made of any appropriate material, such as single crystal silicon, poly silicon, silicon germanium, carborundum, indium antimonide, lead telluride, indium arsenide, indium phosphide, gallium arsenide, gallium antimonite, or alloy semiconductor, etc. In one embodiment, the first semiconductor layer 120 is made of un-doped poly silicon. For illustrative purposes, a first poly silicon layer 120 may be used to refer to the first semiconductor layer 120. The first poly silicon layer 120 may be used to subsequently form a floating gate and a select gate.

In one embodiment, the thickness of the first poly silicon layer 120 may be in a range of approximately 500 Å~2000 Å. In certain other embodiments, other appropriate thickness may be used.

Various processes may be used to form the first poly silicon layer 120, such as a PVD process, a CVD process, an ALD process, or an epitaxial growth process, etc.

Figure 3:
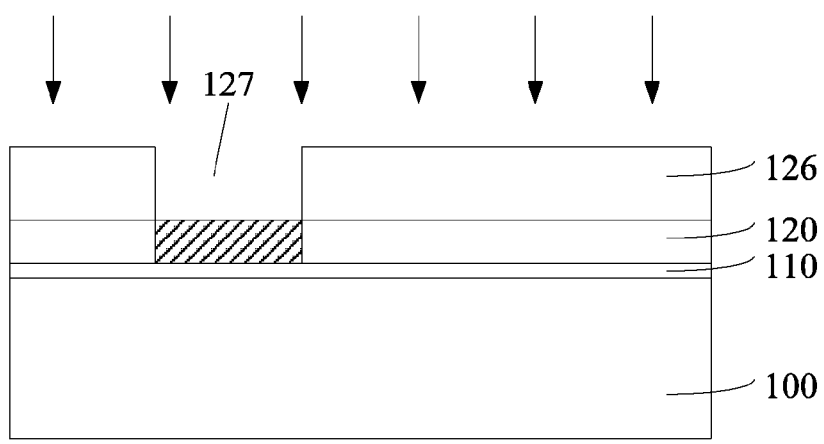

Returning to FIG. 11, after providing the semiconductor substrate 100 and forming the first dielectric layer 110 and the first poly silicon layer 120, a first mask layer having a first opening may be formed on the surface of the first poly silicon layer 120 (S102). FIG. 3 illustrates a corresponding semiconductor structure.

As shown in FIG. 3, a first mask layer 126 is formed on the surface of the first poly silicon layer 120. The first mask layer 126 may have a first opening 127; and the first opening 127 may correspond to the position of a subsequently formed floating gate. The first mask layer 126 may be used as a mask for subsequently forming the floating gate using an ion implantation process.

The first mask layer 126 may be any appropriate type of mask, such as a hard mask, or a photoresist mask, etc. In one embodiment, the first mask layer 126 is a photoresist layer.

A process for forming the first mask layer 126 with the first opening 127 may include forming a photoresist layer on the surface first poly silicon layer 120; and exposing and developing the photoresist layer to form the first opening 127. The first opening 127 may correspond to the position of the subsequently formed floating gate, which may also be the position of a subsequently formed flash cell.

In one embodiment, the size of the first opening 127 may be equal to the subsequently formed floating gate, which may cause ions only to be implanted into a portion of the poly silicon layer 120 corresponding to the subsequently formed floating gate.

After forming the first mask layer 126 with the first opening 127, an ion implantation process may be performed onto the poly silicon layer 120 using the first mask layer 126 as a mask. Referring to FIG. 3, a portion of the first poly silicon layer 120 exposed by the first opening 127 may be doped by the ion implantation process. The portion of the first poly silicon layer 120 may be doped with N-typed ions, or P-type ions. In one embodiment, the portion of the first poly silicon layer 127 is N-typed doped by the ion implantation process. The N-type ions may include phosphorous ions, or arsenic ions, etc.

In the existing fabrication technology, referring to FIG. 1, in order to prevent the N-type ions in the portion of the first poly silicon layer corresponding to the position of the floating gate 12 from diffusing into the portion of the poly silicon layer corresponding to the first select gate 17, the doping concentration of the N-type ions may be limited. However, a significantly small doping concentration of N-type ions may affect the program margin of the flash memory. In the disclosed invention, an oxide layer may be subsequently formed between the floating gate 12 and the first select gate 17 to prevent the diffusion, thus the doping concentration of N-type ions implanted into the portion of the first poly silicon layer 120 corresponding to the position of a subsequently formed floating gate may be significantly high; and the program margin of the flash memory may be improved. In one embodiment, the doping concentration of the N-type ions may be in a range of approximately 5E14 atom/cm$^2$~5E15 atom/cm$^2$. The energy of the ion implantation process may be in range of approximately 5 KeV~60 KeV.

In certain other embodiments, the size of the first opening 127 may be greater than the size of the subsequently formed floating gate, thus the portion of the first poly silicon layer 120 corresponding to the floating gate and adjacent regions of the first poly silicon 120 may all be doped with N-type ions. Unless the opening 127 overlaps with the position of a subsequently formed select gate, the N-type ions may not affect the electrical properties of the subsequently floating gate because the portion of the first poly silicon layer 120 between the subsequently formed floating gate and the subsequently formed select gate may be subsequently removed; and only the floating gate and the select gate may be kept.

Figure 4:
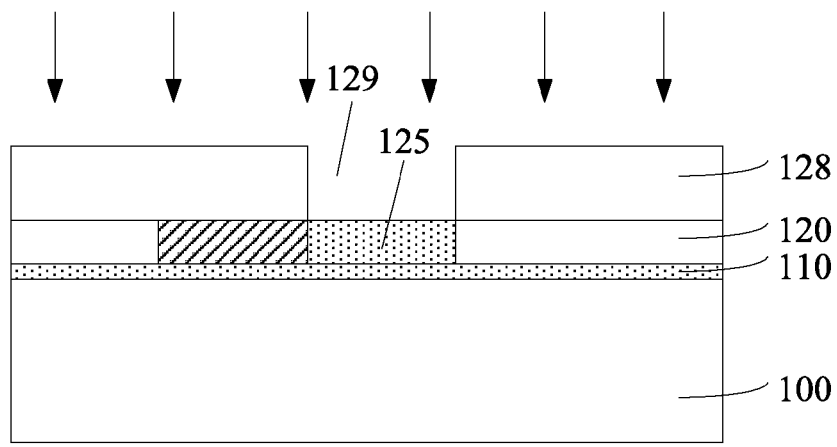

Returning to FIG. 11, after forming the first mask layer 126 and performing the N-type ion implantation process, the first mask layer 126 may be removed; and a second mask layer may be formed (S103). FIG. 4 illustrates a corresponding semiconductor structure.

As shown in FIG. 4, the first mask layer 126 is removed; and a second mask layer 128 is formed on the surface of the first poly silicon layer 120. The second hard mask layer 128 may have a second opening 129; and the second opening 129 may be used to expose a portion of the first poly silicon layer 120 for a subsequent ion implantation process.

Various process may be used to remove the first hard mask layer 126, such as a dry etching process, or wet etching process, etc. In one embodiment, the first hard mask layer 126 is removed by a plasma ashing process.

The second hard mask layer 128 may be any appropriate type of mask, such as a hard mask, a shadow mask, or a photoresist mask, etc. In one embodiment, the second mask 128 is a photoresist mask. A process for forming the second mask 128 with the second opening 129 may include forming a photoresist layer on the first poly silicon layer 120; and exposing and developing the photoresist layer to form the second opening 129 in the photoresist layer. The second opening 129 may expose a portion of the first poly silicon layer 120 between the position corresponding to a subsequently formed floating gate and the position corresponding to a subsequently formed first select gate, thus after forming an oxide layer in the portion of the first poly silicon 120, the oxide layer may be formed between the portion of the first poly silicon layer 120 corresponding to the subsequently formed floating gate and the portion of the first poly silicon layer 120 corresponding to the subsequently formed select gate. The size of the second opening 129 may be equal to, or smaller than the distance between the subsequently formed floating gate and the subsequently formed first select gate.

Referring to FIG. 4, after forming the second hard mask layer 128 with the opening 129 on the surface of the first poly silicon layer 120, an oxygen ion implantation process may be performed onto the portion of the first poly silicon layer 120 exposed by the second opening 129; and an silicon oxide layer 125 may be formed. The silicon oxide layer 125 may be formed on the dielectric layer 110 between the subsequently formed floating gate and the subsequently formed first select gate.

The doping concentration of the oxygen ion implantation process may be in a range of approximately 5E12 atom/cm$^2$~1E15 atom/cm$^2$. The energy of the oxygen ion implantation process may be in a range of approximately 1 KeV~50 KeV. The direction of the oxygen ion implantation process, i.e., an angle between the ion direction and the normal direction of the semiconductor substrate 100, may be in a range of approximately −5°~5°. In one embodiment, the direction of the oxygen ion implantation process is 0°. The thickness of the oxide layer 125 may be adjusted by the energy of the oxygen ion implantation process.

In certain other embodiments, the silicon oxide layer 125 may be formed by a thermal oxidation process, or a chemical oxidation process, etc.

In one embodiment, the portion of the first poly silicon layer 120 corresponding to the position of the subsequently formed floating gate may be doped by an N-type ion implantation process firstly, then an oxygen ion implantation process may be performed onto the portion of the first poly silicon layer 120 between the position of the subsequently formed floating gate and the position of the subsequently formed select gate. After the completion of the oxygen ion implantation process, a first thermal annealing process, such as a peak temperature annealing process, or a constant temperature annealing process, etc., may be performed, thus the implanted oxygen ions may be activated to react with Si in the first poly silicon layer 120; and the silicon oxide layer 125 may be formed.

Because the first thermal annealing process may be performed after the oxygen ion implantation process, the N-type ions in the portion of first poly silicon layer 120 corresponding to the position of the subsequently formed floating gate may be unable to diffuse into the portion of the first poly silicon layer 120 corresponding to the position of the subsequently formed select gate because the N-type ions may be blocked by the silicon oxide layer 125. Therefore, a poly silicon depletion layer may be unable to form in the subsequently formed first select gate; the writing/reading efficiency of the flash memory may be improved; and the working stability of the flash memory may be enhanced.

In certain other embodiments, the oxygen ion implantation process may be performed onto the portion of the first poly silicon layer 120 between the position corresponding to the subsequently formed floating gate and the position corresponding to the subsequently formed select gate firstly; and then the first thermal annealing process may be performed to form the silicon oxide layer 125. When the N-type ion implantation process is performed onto the portion of the first poly silicon layer 120 corresponding the position of the subsequently formed floating gate, the N-type ions may be unable to diffuse into the portion of the first poly silicon layer 120 corresponding to the position of the subsequently formed select gate because the silicon oxide layer 125 may block the N-type ions.

The thickness of the silicon oxide layer 125 may be smaller than, or equal to the thickness of the first poly silicon layer 120. Because the silicon oxide layer 125 may be in between the position corresponding to the subsequently formed floating gate and the position corresponding to the subsequently formed first select gate, the silicon oxide layer 125 may isolate, or partially isolate the portion of the first poly silicon layer 120 corresponding to the position of the subsequently formed floating gate and the portion of the poly silicon layer 120 corresponding to the position of the subsequently formed first select gate, it may be difficult for the N-type ions in the portion of the first poly silicon layer 120 corresponding to the position of the subsequently formed floating gate to diffuse into the portion of the first poly silicon layer 120 corresponding to the position of the subsequently formed first select gate. Thus, a poly silicon depletion layer may be unable to form in the subsequently formed first select gate. Such a poly silicon depletion layer may cause the on/off states of the channel region under the select gate to be difficult to control; and cause the data misreading. Thus, the working stability of a flash memory having such a depletion layer may be unable to match requirements.

In one embodiment, the depth of the oxygen ion implantation may be equal to, or greater than the thickness of the first poly silicon layer 120. Such a depth may cause the portion of the first poly silicon layer 120 between the portion of the first poly silicon layer 120 corresponding to the position of the subsequently formed floating gate and the portion of the first poly silicon layer 120 corresponding to the position of the subsequently formed select gate to be completely oxidized to form the silicon oxide layer 125; and the oxide layer 125 may completely prevent the N-type ions from diffusing into the portion of the first silicon layer 120 corresponding the position of the subsequently formed select gate.

In certain other embodiments, the first poly silicon layer 120 is made of other appropriate kinds of semiconductor material; a corresponding oxide layer may be formed by any appropriate process.

Figure 5:
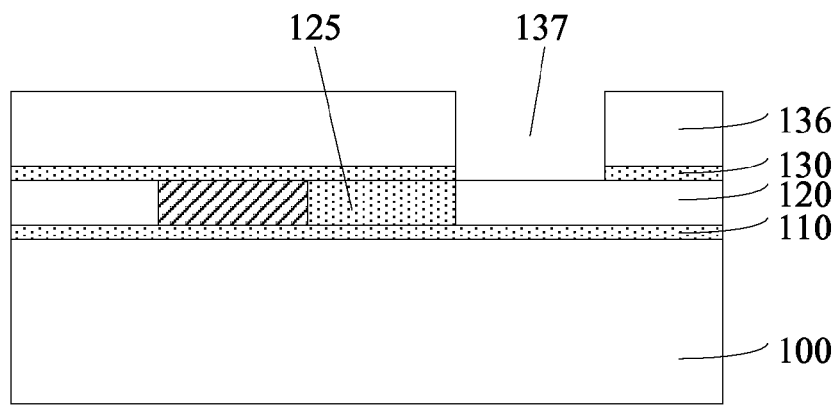

Returning to FIG. 11, after forming the silicon oxide layer 125, the second mask layer 128 may be removed; a second dielectric layer may be formed; and a third mask layer may be formed (S104). FIG. 5 illustrates a corresponding semiconductor structure.

As shown in FIG. 5, the second mask layer 128 is removed; a second dielectric layer 130 may be formed on the surface of the first poly silicon layer 120 and the surface of the silicon oxide layer 125; and a third mask layer 136 may be formed on the second dielectric layer 130. Further, a third opening 137 may be formed in the third mask layer 136.

The second hard mask layer 128 may be removed by any appropriate process, such as a dry etching process, or a wet etching process, etc. In one embodiment, the second mask layer 128 is removed by a plasma ashing process.

The second dielectric layer 130 may be made of any appropriate material, such as silicon oxide, silicon nitride, or silicon oxynitride, etc. The second dielectric layer 130 may be a single layer structure, or a multiple-stacked structure. In one embodiment, the second dielectric layer 130 is a multiple-stacked structure including a silicon oxide layer, a silicon nitride layer and a silicon oxide layer, thus the second dielectric layer 130 may be referred as an "ONO" layer. The second dielectric layer 130 may be used to subsequently form a control gate dielectric layer.

Various processes may be used to form the second dielectric layer 130, such as a CVD process, a PVD process, an ALD process, or an FCVD process, etc.

The third mask layer 136 may be a hard mask layer, or a photoresist layer, etc. In one embodiment, the third mask layer 136 is a photoresist layer. A process for forming the third mask layer 136 with the third opening 137 may include forming a photoresist layer on the surface of the second dielectric layer 130; and exposing and developing the photoresist layer to form the third opening 137. The position of the third opening 137 may correspond to the position of a subsequently formed select gate.

In one embodiment, the size of the third opening may be equal to the size of the subsequently formed select gate. Such a size may cause a subsequently formed second select gate to be totally on the surface of the subsequently formed first select gate, thus the P-type ions in the second select gate may directly diffuse into the first select gate; and the entire select gate consisting of the first select gate and the second select gate may be P-type doped. In certain other embodiments, the size of the third opening 137 may be slightly greater, or smaller than the size of the subsequently formed select gate.

After forming the third opening 137, an opening (not labeled) may be formed in the second dielectric layer 130 under the third opening 137. The opening may be formed by etching a portion of the second dielectric layer 130 exposed by the third opening 137 using the third opening 137 as an etching mask. The size of the opening in the second dielectric layer 130 may be greater, smaller, or equal to the size of the subsequently formed select gate. The opening in the second dielectric layer 130 may be used to expose a portion of the first poly silicon layer 130 corresponding to a position of the subsequently formed first select gate.

Various processes may be used to etch the second dielectric layer 130, such as a dry etching process, a wet etching process, or an ion beam etching process, etc. In one embodiment, the second dielectric layer 130 is etched by a dry etching process to form the opening.

Figure 6:
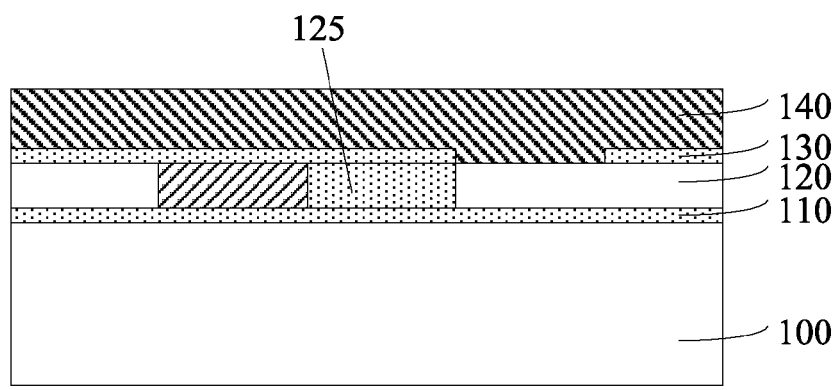

Returning to FIG. 11, after etching the portion of the second dielectric layer 130, the third mask layer 136 may be removed; and a second semiconductor layer may be formed (S105). FIG. 6 illustrates a corresponding semiconductor structure.

As shown in FIG. 6, the third mask layer 136 is removed; and a second semiconductor layer 140 is formed on the surface of the second dielectric layer 130 and the surface of the portion of the first poly silicon layer 120 exposed by the opening in the second dielectric layer 130.

The third mask layer 136 may be removed by any appropriate process, such as a wet etching process, or a dry etching process, etc.

The second semiconductor layer 140 may be made of any appropriate material, such as single crystal silicon, poly silicon, silicon germanium, carborundum, indium antimonide, lead telluride, indium arsenide, indium phosphide, gallium arsenide, gallium antimonite, or alloy semiconductor, etc. In one embodiment, the second semiconductor layer 140 is made of un-doped poly silicon. For illustrative purposes, a second poly silicon layer 140 may be used to refer to the second semiconductor layer 140. The second poly silicon layer 140 may used to subsequently form a control gate and a second select gate.

Various processes may be used to form the second poly silicon layer 140, such as a CVD process, a PVD process, an ALD process, or an epitaxy process, etc.

In one embodiment, the portion of the second poly silicon layer 140 corresponding to the position of the subsequently formed control gate and the portion of the second poly silicon layer 140 corresponding to the position of the subsequently formed second select gate may be doped with P-type ions. Various processes may be used to dope the second poly silicon layer 140, such as an ion implantation process, or an in situ doping process, etc. In one embodiment, an ion implantation process is used to dope the second poly silicon layer 140. The P-type ions may include boron ions, or indium ions, etc. The doping concentration of the P-type ions may be in a range of approximately 5E14 atom/cm$^2$~5E15 atom/cm$^2$. The energy of the ion implantation process may be in a range of approximately 1 KeV~20 KeV.

In certain other embodiments, the portion of the second poly silicon layer 140 corresponding to the position of subsequently formed control gate may be doped with P-type ions; and the portion of the second poly silicon layer 140 corresponding to the position of the subsequently formed second select gate may be doped with N-type ions.

In certain other embodiments, the entire second poly silicon layer 140 may be doped with P-type ions.

Figure 7:
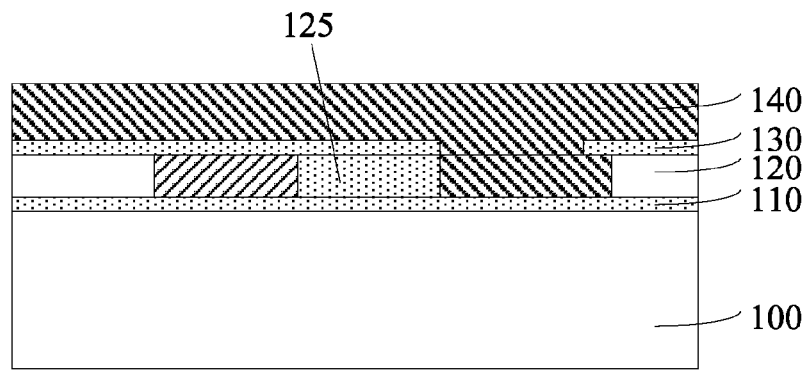

Returning to FIG. 11, after forming the second ploy silicon layer 140 with doped with P-type ions, a second annealing process may be performed (S106). FIG. 7 illustrates a corresponding semiconductor structure.

As shown in FIG. 7, a portion of the first poly silicon layer 120 is doped by P-type ions after the second thermal annealing process because the P-type ions in the second poly silicon layer 140 may diffuse into the first poly silicon layer 120 after the second thermal annealing process.

Various annealing processes may be used as the second thermal annealing process, such as peak-temperature annealing process, a constant-temperature thermal annealing process, or a laser annealing process, etc. The P-type ions may be activated by the second thermal annealing process; and diffuse into the first poly silicon layer 120.

In certain other embodiments, the second thermal annealing process may be performed after subsequently forming the select gate by an etching process. Because the subsequently formed select gate may include a first select gate and a second select gate formed on the surface of the first select gate, after the second thermal annealing process, the P-type ions in the second select gate may diffuse into the first select gate, thus the entire select gate may be doped with the P-type ions.

In certain other embodiments, after the oxygen ion implantation process, the first annealing process may be omitted, only the second thermal annealing process may be performed. The second thermal annealing process may not only cause the P-type ions in the second poly silicon layer 140 to diffuse into the first poly silicon layer 120, but also activate the oxygen ions to react with Si in the first poly silicon layer 120 to form the silicon oxide layer 125, thus the thermal budget may be reduced.

Figure 8:
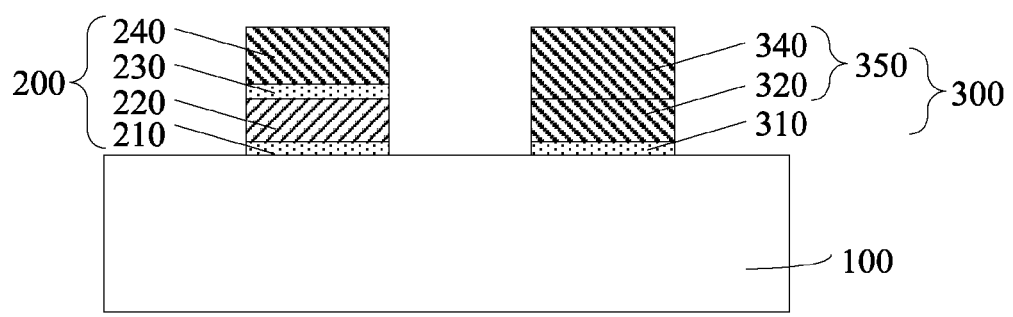

Returning to FIG. 11, after performing the second thermal annealing process, a flash cell and a select gate structure may be formed (S107). FIG. 8 illustrates a corresponding semiconductor structure.

As shown in FIG. 8, a flash cell 200 is formed on the surface of the semiconductor substrate 100; and a select gate structure 300 is formed on the surface of the semiconductor substrate 100 at one side of the flash cell 200. The flash cell 200 may include a floating gate dielectric layer 210 formed on the surface of the semiconductor substrate 100, a floating gate 220 formed on the surface of the floating gate dielectric layer 210, a control gate dielectric layer 230 formed on the surface of the floating gate 220 and a control gate 240 formed on the surface of the control gate dielectric layer 230. The select gate structure 300 may include a select gate dielectric layer 310 formed on the surface of the semiconductor substrate 100, a first select gate 320 formed on the surface of the select gate dielectric layer 310 and a second select gate 340 formed on the surface of the first select gate 320. The first select gate 320 and the second select gate 340 may form a select gate 350.

Referring to FIG. 7, the flash cell 200 and the select gate structure 300 may be formed by etching the first dielectric layer 110, the first poly silicon layer 120, the second dielectric layer 130, the oxide layer 125 and the second poly silicon layer 140. In one embodiment, the first dielectric layer 110 may be etched to form the floating gate dielectric layer 210 and the select gate dielectric layer 310. The first poly silicon layer 120 may be etched to form the floating gate 220 and the first select gate 320; and the silicon oxide layer 125 may be removed. The second dielectric layer 130 may be etched to form the control gate dielectric layer 230. The second poly silicon layer 140 may be etched to form the control gate 240 and the second select gate 340.

Various processes may be used to etch the first dielectric layer 110, the first poly silicon layer 120, the second dielectric layer 130, the oxide layer 125 and the second poly silicon layer 140, such a dry etching process, a wet etching process, or an ion beam etching process, etc.

Because the silicon oxide layer 125 may be formed between the floating gate 220 and the first select gate 310; and the silicon oxide layer 125 may prevent the N-type ions from laterally diffusing, a poly silicon depletion layer may unlikely be formed in the first select gate 320. Thus, the performance of the flash memory may be enhanced.

Returning to FIG. 11, after forming the flash cell 200 and the select gate structure 300, sidewall spacers may be formed on side surfaces of the flash cell 200 and the select gate structure 300 (S108). FIG. 9 illustrates a corresponding semiconductor structure.

As shown in FIG. 9, sidewall spacers 400 are formed on side surfaces of the flash cell 200 and the select gate structure 300. The sidewall spacers 400 may be used as a mask layer for a subsequent ion implantation process. The sidewall spacers 400 may prevent the doping ions of the subsequent ion implantation process from being implanted into the flash cell 200 and the select gate structure 300, thus the electrical properties of the flash cell 200 and the select gate structure 300 may not be affected.

A process for forming the sidewall spacers 400 may include forming a sidewall spacer material layer on the surfaces of the semiconductor substrate 100, the flash cell 200 and the select gate structure 300; and followed by an etch back process. Thus, portions of the sidewall spacer material layer on the surface of the semiconductor substrate 100, the top surfaces of the flash cell 200 and the select gate structure 300 may be removed; and the sidewall spacers 400 may be formed on the side surfaces of the flash cell 200 and the select gate structure 300.

The sidewall spacer material layer may be formed by any appropriate process, such as a CVD process, a PVD process, an ALD process, or an FCVD process, etc.

Returning to FIG. 11, after forming the sidewall spacers 400, a source region, a drain region and a co-source/drain region may be formed (S109). FIG. 10 illustrates a corresponding semiconductor structure.

As shown in FIG. 10, a co-source/drain region 101 is formed in the semiconductor substrate 100 between the flash cell 200 and the select gate structure 300; a source region 102 is formed in the semiconductor substrate 100 at the other side of the flash cell 200; and a drain region 103 may be formed in the semiconductor substrate 100 at the other side of the select gate structure 300.

Various processes may be used to form the co-source/drain region 101, the source region 102 and the drain region 103, such as an ion implantation process, a thermal diffusion process, or an embedded process, etc. In one embodiment, the co-source/drain region 101, the source region 102 and the 103 are formed by an ion implantation process. Specifically, an ion implantation process may be performed onto the semiconductor substrate 100 using the flash cell 200, the select gate structure 300 and the sidewall spacers 400 as a mask. Thus, the co-source/drain region 101 may be formed in the semiconductor substrate 100 between the flash cell 200 and the select structure 300; the source region 102 may be formed in the semiconductor substrate 100 at the other side of the flash cell 200; and the drain region 103 may be formed in the semiconductor substrate 103 at the other side of the select gate structure 300, simultaneously. The doping ions of the ion implantation process may include P-type ions, or N-type ions.

In certain other embodiments, the co-source/drain region 101, the source region 102 and the drain region 103 may be formed separately.

In certain other embodiments, the drain region 103 may be formed in the semiconductor substrate 100 at the other side of the flash cell 200; and the source region 102 may be formed in the semiconductor substrate 100 at the other side of the select gate structure 300.

After forming the co-source/drain region 101, the source region 102 and the drain region 103, bit line structures (not shown) may be formed on the surface of the co-source/drain region 101, the source region 102 and the drain region 103. The bit line structures may be formed by any appropriate processes.

Thus, a flash memory may be formed by above disclosed methods and processes; and a corresponding flash memory is illustrated in FIG. 10. As shown in FIG. 10, the flash memory includes a semiconductor substrate 100. The flash memory also includes a flash cell 200 having a floating gate dielectric layer 210 formed on the surface of the semiconductor substrate 100, a floating gate 220 formed on the surface of the floating gate dielectric layer 210, a control gate dielectric layer 230 formed on the surface of the floating gate 220 and a control gate 240 formed on the surface of the control gate dielectric layer 230. Further, the flash memory includes a select gate structure 300 having a select gate dielectric layer 310 formed on the surface of the semiconductor substrate 100, a first select gate 320 formed on the surface of the select gate dielectric layer 210 and a second select gate formed on the surface of the first select gate 320. Further, the flash memory also includes a co-source/drain region 101 formed in the semiconductor substrate 100 between the flash cell 200 and the select gate structure 300, a source region 102 formed in the semiconductor substrate 100 at the other side of the flash cell 200 and a drain region 300 formed in the semiconductor substrate 100 at the other side of the select gate structure 300.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a flash memory, comprising:
   providing a semiconductor substrate
   forming a first dielectric layer on a surface of the semiconductor substrate;
   forming a first semiconductor layer on a surface of the first dielectric layer;
   performing an ion implantation process onto a portion of the first semiconductor layer corresponding to a position of a subsequently formed floating gate;
   performing an oxygen ion implantation process onto a portion of the first semiconductor layer between the position of the subsequently formed floating gate and the position of a subsequently formed first select gate to form an oxide layer;
   forming a second dielectric layer having an opening exposing the position of the first select gate on the first semiconductor layer;
   forming a second semiconductor layer on the second dielectric layer; and
   forming a flash cell and a select gate structure by etching the first dielectric layer, the first semiconductor layer, the oxide layer, the second dielectric layer and the second semiconductor layer.

2. The method according claim 1, wherein:
   the flash cell includes the N-type doped portion of the first semiconductor layer as the floating gate and a portion of the second semiconductor layer as a control gate; and
   the select gate structure includes the first select gate formed by the portion of the first semiconductor exposed by the opening as the first select gate and a portion of the second semiconductor layer as a second select gate.

3. The method according claim 1, wherein:
   ions for the ion implantation process are N-type ions.

4. The method according claim 1, before performing the ion implantation process onto the portion of the first semiconductor layer corresponding to the position of a subsequently formed floating gate, further including:
   forming a first mask layer having a first opening exposing the portion of the first semiconductor layer corresponding to the position of the floating gate on the surface of the first semiconductor layer.

5. The method according to claim 1, after performing the oxygen ion implantation process onto a portion of the first semiconductor layer between the position of the subsequently formed floating gate and the position of the subsequently formed first select gate, further including:
   performing a first thermal annealing process.

6. The method according claim 1, after forming the second dielectric layer having an opening exposing the position of the first select gate, further including:
   forming a third mask layer having a third opening exposing the position of the first select gate; and
   forming the opening exposing the position of the first select gate by etching the second dielectric layer using the third mask layer as a mask.

7. The method according claim 1, wherein:
   the first semiconductor layer is made of poly silicon; and
   the second semiconductor layer is made of poly silicon.

8. The method according to claim 1, after forming the flash cell and the select gate structure, further including:
   forming sidewall spacers on side surfaces of the flash cell and the select gate structure.

9. The method according to claim 1, after forming the second semiconductor layer, further including:
   performing a P-type ion implantation process onto the second semiconductor layer; and
   performing a second thermal annealing process.

10. The method according to claim 1, wherein:
    N-type ions of the N-type ion implantation process include phosphorous ions, or arsenic ions.

11. The method according to claim 1, wherein:
    a dose of the oxygen ion implantation process is in a range of approximately 5E12 atom/cm$^2$~1E15 atom/cm$^2$;
    an energy of the oxygen ion implantation process is in a range of approximately 1 KeV~50 KeV; and
    an implantation angle of the oxygen ion implantation process is in a range of approximately −5°~5°.

12. The method according to claim 1, wherein:
    a thickness of the first semiconductor layer is in a range of approximately 500 Å~2000 Å.

13. The method according to claim 1, wherein:
    a width of the oxide layer is equal to, or smaller than a minimum distance between the floating gate and the first select gate.

14. The method according claim 2, before performing the oxygen ion implantation process onto the portion of the first semiconductor layer between the position of the subsequently formed floating gate and the position of the subsequently formed first select gate, further including:
    removing the first mask layer; and
    forming a second mask layer having a second opening exposing the portion of the semiconductor layer between the position of the subsequently formed floating gate and the position of the subsequently formed first select gate.

15. The method according to claim 7, wherein:
    a dose of the P-type ion implantation is in a range of approximately 5E14 atom/cm$^2$~5E15 atom/cm$^2$.

* * * * *